United States Patent [19]

Collette et al.

[11] 4,042,858
[45] Aug. 16, 1977

[54] TELEVISION RECEIVER PROTECTION CIRCUIT

[75] Inventors: Robert P. Collette; Robert C. Wheeler, both of Elba, N.Y.

[73] Assignee: GTE Sylvania Incorporated, Stamford, Conn.

[21] Appl. No.: 703,613

[22] Filed: July 8, 1976

[51] Int. Cl.² .............................................. H01J 29/52
[52] U.S. Cl. .................................... 315/379; 315/408
[58] Field of Search ............... 315/379, 380, 381, 408; 323/44 R, 60

[56] References Cited

U.S. PATENT DOCUMENTS 3,749,966  7/1973  Ahrens et al. ........................ 315/408
3,898,522  8/1975  Klein et al. .......................... 315/379

Primary Examiner—Maynard R. Wilbur
Assistant Examiner—T. M. Blum
Attorney, Agent, or Firm—Norman J. O'Malley; Robert T. Orner; Theodore D. Lindgren

[57] ABSTRACT

A protection circuit for a television receiver which disables the television receiver by disabling the horizontal deflection circuit in response to fault conditions is shown. The protection circuit detects excessive current drain by a low voltage supply, excessive current drain by a high voltage supply, and excessive high voltage. In response to any one of these fault conditions, the horizontal deflection circuit is disabled.

6 Claims, 2 Drawing Figures

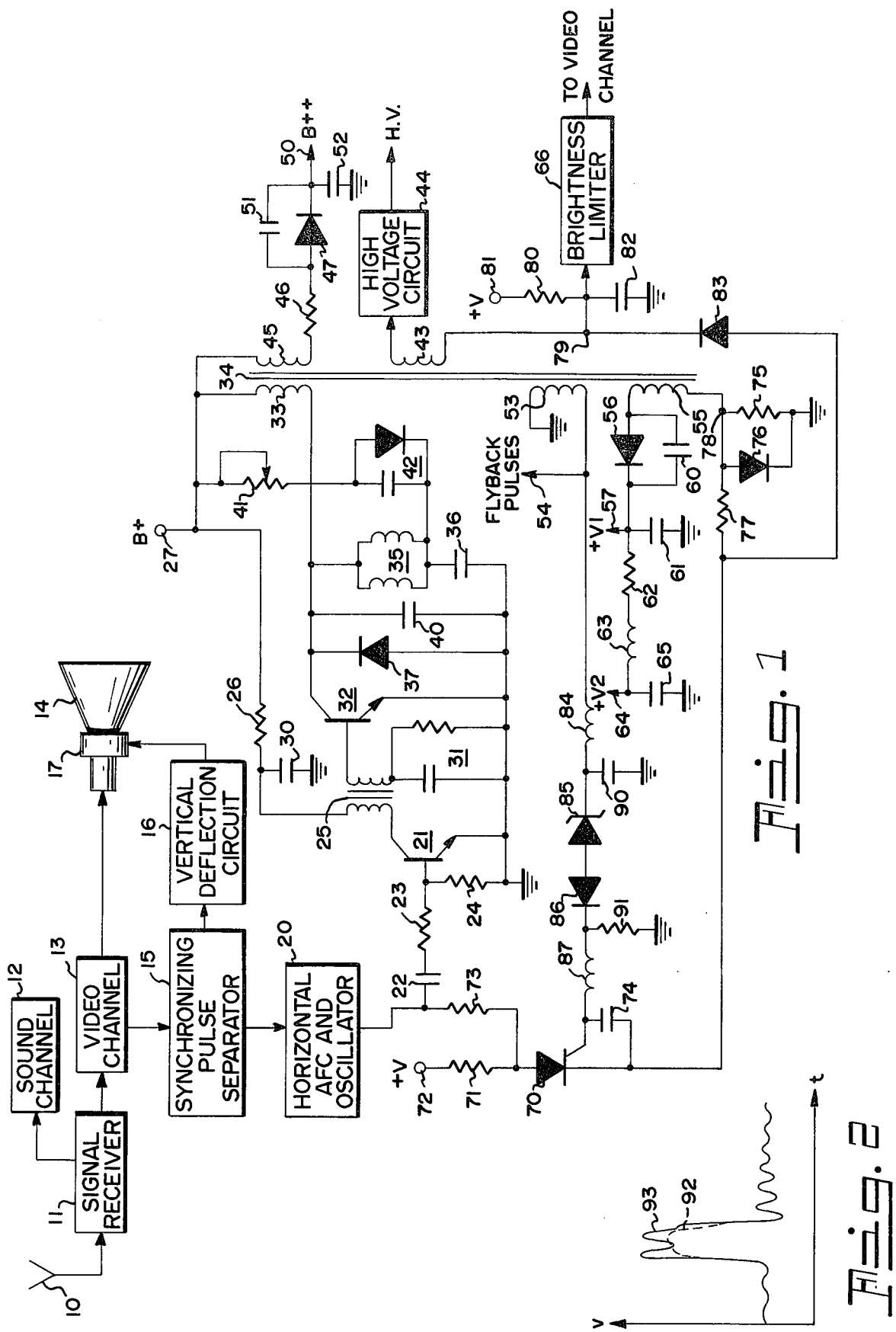

TELEVISION RECEIVER PROTECTION CIRCUIT

FIELD OF THE INVENTION

This invention relates to television receiver protection circuitry and more particularly to a television receiver protection circuit which disables the horizontal deflection circuit in response to fault conditions.

BACKGROUND OF THE INVENTION

Various prior art techniques for protecting against various fault conditions in television receivers are known. These techniques generally protect against power supply and horizontal deflection faults as well as other faults which produce an effect in the power supply or horizontal deflection circuit. While prior art techniques are known to protect against various faults, incorporation of all of these various known techniques in a single television receiver generally results in unduly complex and/or expensive protection circuitry. Accordingly, prior art television receivers typically include protection against the faults most likely to occur in that particular television receiver. Thus, when a less frequent fault does occur, substantial damage may follow requiring replacement or repair of numerous expensive components.

OBJECTS OF THE INVENTION

Accordingly, it is a primary object of this invention to obviate the above-noted and other disadvantages of the prior art.

It is a further object of this invention to provide new and novel protection circuitry for a television receiver.

It is a still further object of this invention to provide a protection circuit which protects against numerous fault conditions.

It is a yet further object of this invention to provide a protection circuit which protects against numerous fault conditions without undue complexity or expense.

SUMMARY OF THE INVENTION

The above and other objects and advantages of this invention are achieved in a protection circuit for a television receiver which has an image display device, a horizontal deflection winding associated therewith, a horizontal deflection circuit connected to the horizontal deflection winding, and an output transformer connected to the horizontal deflection circuit. The television receiver further includes a low voltage supply including a first winding of the output transformer and a high voltage supply including a second winding of the output transformer. The protection circuit includes switching means and first, second, and third sensing means. The switching means is connected to the horizontal deflection circuit for disabling the horizontal deflection circuit in response to fault conditions. The first sensing means is connected to the low voltage supply and to the switching means for providing a disablement signal to the switching means in response to current flow through the low voltage supply in excess of a predetermined magnitude. The second sensing means is connected to the high voltage supply and to the switching means for providing a disablement signal to the switching means in response to current flow through the high voltage supply in excess of a predetermined magnitude. The third sensing means is connected to the switching means and includes a third winding of the output transformer for providing a disablement signal to the switching means in response to voltage pulses across said third winding in excess of a predetermined magnitude.

BRIEF DESCRIPTION OF THE DRAWINGS

FIG. 1 is a block and schematic diagram of a television receiver incorporting a preferred embodiment of the invention; and FIG. 2 is a waveform diagram to aid in explaining the operation of the invention.

DETAILED DESCRIPTION OF THE PREFERRED EMBODIMENT

For a better understanding of the present invention, together with other and further objects, advantages and capabilities thereof, reference is made to the following disclosure in conjunction with the accompanying drawings.

In FIG. 1 typical television receiver components are shown in block diagram form. A signal receiving means illustrated as an antenna 10 is connected to an input of a signal receiver 11 for providing an RF signal modulated with a composite video signal thereto. Signal receiver 11 includes the usual RF and IF circuitry for processing the received television signal and provides the audio portion thereof to a sound channel 12 and the video portion thereof to a video channel 13. Video channel 13 includes the usual luminance circuitry, and in the case of a color television receiver, the usual chrominance circuitry. Video channel 13 provides one or more video signals to an image display device illustrated as a cathode ray tube (CRT) 14.

At least the synchronizing pulse portion of the composite video signal in video channel 13 is coupled to a synchronizing pulse separator 15. Sync pulse separator 15 separates the vertical synchronizing pulses and couples them to a vertical deflection circuit 16. Vertical deflection circuit 16 provides suitable vertical deflection signals to a vertical deflection winding contained in a yoke 17 associated with CRT 14. Sync pulse separator 15 also couples horizontal synchronizing pulses to a horizontal deflection circuit which includes a horizontal AFC and oscillator 20 connected to the output of sync pulse separator 15.

The horizontal deflection circuit further includes a driver transistor 21. An output of oscillator 20 is connected by a capacitor 22 in series with the resistor 23 to a base of transistor 21 which is further connected by a resistor 24 to circuit ground. An emitter of transistor 21 is also connected to circuit ground. A collector of transistor 21 is connected by a primary winding of a driver transformer 25 in series with a resistor 26 to a B+ voltage source illustrated as a terminal 27. The junction of the primary winding of transformer 25 and resistor 26 is connected by a capacitor 30 to circuit ground. B+ voltage supply 27 is typically developed by rectification of the AC line voltage. Also, the B+ voltage is preferably regulated, for example, by a series regulator.

One end of a secondary winding of transformer 25 is connected by a parallel RC circuit 31 to circuit ground while the other end is connected to a base of a horizontal output transistor 32. An emitter of transistor 32 is connected to circuit ground and a collector is connected via a primary winding 33 of an output transformer 34 to source 27. Those skilled in the art will realize that various components associated with transistors 21 and 32 are not illustrated in FIG. 1 for clarity.

For example, wave shaping and parasitic suppression circuitry is normally included.

A horizontal deflection winding 35 is illustrated as a pair of parallel connected windings. One end of winding 35 is connected to the collector of transistor 32 while the other end is connected by an S-shaping capacitor 36 to circuit ground. Winding 35 is typically included in yoke 17 and associated with CRT 14 for deflecting an electron beam or beams therein in the horizontal direction. A damper diode 37 and a retrace capacitor 40 are each connected between circuit ground and the collector of transistor 32. Source 27 is connected by a horizontal centering control 41 and a parallel connected capacitor and diode 42 to the junction of winding 35 and capacitor 36 for biasing winding 35.

In normal operation oscillator pulses from oscillator 20 are coupled to the base of transistor 21 which drives output transistor 32 via transformer 25. At the start of the trace interval, diode 37 conducts current to winding 35 to provide the first half of the trace signal. Transistor 32 is turned on to provide the second half of the trace signal. At the end of the trace interval, transistor 32 is switched off to interrupt the current flow through winding 35. Winding 35 and capacitor 40 oscillate for one-half cycle to reverse the current flow through winding 35 thereby providing horizontal retrace. Accordingly, capacitor 40 is selected to have a value such that winding 35 and capacitor 40 resonate with a period twice the retrace interval. When transistor 32 is turned off, current flow through winding 33 is also interrupted thereby providing a horizontal output or flyback pulse in various secondary windings of transformer 34. Such flyback pulses are typically used for various purposes such as gating or timing pulses and for energizing various secondary voltage sources.

One such secondary voltage source is the high voltage supply which includes a secondary winding 43 on transformer 34. Winding 43 has one end connected to a high voltage circuit 44 which provides a high voltage to the anode of CRT 14. The focus electrode voltage for CRT 14 can also be developed from high voltage circuit 44. Typically, high voltage circuit 44 can include a voltage multiplier or tripler which rectifies and multiplies the flyback pulses developed across winding 43.

Another secondary voltage source includes a winding 45 on transformer 34. One end of winding 45 is connected to source 27 while the other end is connected by a resistor 46 in series with a diode 47 to a B++ terminal 50. A transistor suppression capacitor 51 is connected in parallel with diode 47 while a filter capacitor 52 is connected from terminal 50 to circuit ground. Diode 47 rectifies the flyback pulses across winding 45 to provide the B++ voltage at terminal 50. The B++ voltage is typically supplied to the video output amplifiers in video channel 13.

Another secondary winding 53 on transformer 34 is connected between circuit ground and a terminal 54. Winding 53 provides flyback pulses to terminal 54 which can be used, for example, for gating the color burst signal, keying the AGC circuit, energizing the pincushion correction or convergence circuitry, or similar functions. In one practical application of the disclosed embodiment of the invention, the pulses at terminal 54 were used to energize the cathode heater in CRT 14.

Another secondary winding 55 is included in a low voltage supply. One end of winding 55 is connected via a diode 56 to a terminal 57 to supply a +V1 voltage. A capacitor 60 is connected in parallel with diode 56 to suppress the switching transients of diode 56. A filter capacitor 61 is connected from terminal 57 to circuit ground for filtering the +V1 voltage. Terminal 57 is further connected by a resistor 62 in series with a coil 63 to a terminal 64. Terminal 64 is connected by a filter capacitor 65 to circuit ground. A voltage +V2 is provided at terminal 64. Voltages +V1 and +V2 are supplied to the various television receiver circuits to provide low voltage energization thereof.

Typical television receivers can also include brightness limiter circuitry for limiting the beam current in CRT 14. In the illustrated embodiment in FIG. 1, the return side of winding 43 is connected to an input of a brightness limiter circuit 66 which provides a brightness limiting signal to video channel 13.

Various fault conditions in the television receivers can cause substantial damage to components therein necessitating substantial and expensive repair or other deleterious effects. For example, if diode 56 shorts, voltages +V1 and +V2 may increase sufficiently to damage circuitry energized thereby. Conversely, shorts in the circuitry energized by the low voltages can cause damage to the low voltage supply. Excessive anode current drain by CRT 14, which can be caused by shorts to circuit ground or a damaged CRT, can cause damage to high voltage circuit 44 and other components associated therewith. Similarly, shorts in high voltage circuit 44 can cause excessive current flow therethrough which can damage other circuit components such as CRT 14 or transformer 34.

Other faults can cause transformer 34 to provide undesirably high amplitude flyback pulses which can cause undesirably high voltages from high voltage circuit 44. Such high voltages can cause excessive X-radiation by CRT 14 and other deleterious effects. One cause of excessive high voltage is failure of the voltage regulator in a mode which permits the B+ voltage to increase. Another fault which can cause excessive high voltage is failure of retrace capacitor 40. While the above-indicated faults are those that more commonly occur, other faults can cause excessive high voltage or current drain from one of the voltage supplies. For example, a repairman may test a chassis with an improper yoke impedance which can cause excessive high voltage. These faults as well as other faults are protected against by protection circuitry in accordacne with the invention.

A protection circuit in accordance with the invention includes a switching means connected to the horizontal deflection circuit for disabling the horizontal deflection circuit in response to fault conditions. In FIG. 1 the switching means is illustrated as a controlled rectifier or SCR 70 which has an anode electrode connected by a resistor 71 to a source of energizing potential illustrated as a terminal 72. Source 72 is preferably independent of the sources developed from output transformer 34 so that SCR 70 remains energized when the horizontal deflection circuit is inoperative. The anode of SCR 70 is further connected by a resistor 73 to the junction of oscillator 20 and capacitor 22. SCR 70 further has a cathode electrode connected by a capacitor 74 to a control or gate electrode.

A first sensing means is connected to the low voltage supply including winding 55 on transformer 34. The sensing means includes a current sensing resistor 75 connected between an end of winding 55 and a potential reference level illustrated as circuit ground. A diode 76 is connected in parallel with resistor 75, while a resistor 77 is connected from junction 78 of winding 55 and resistor 75 to the cathode of SCR 70.

Current provided to terminals 57 and 64 through the low voltage supply also flows through resistor 75 to develop a negative voltage at junction 78. Resistor 75 is preferably small so that the voltage developed at junction 78 is insufficient to switch SCR 70 on under normal operating conditions. If a fault occurs such as diode 56 becoming short circuited or a short circuit occurs in the loads connected to terminals 57 or 64, additional current will flow through the low voltage supply and resistor 75. Accordingly, an increased negative voltage will appear at junction 78. When the current flow through the low voltage supply exceeds a predetermined magnitude, the negative voltage coupled to the cathode of SCR 70 will switch SCR 70 on. Under some fault conditions the voltage at junction 78 will swing both negative and positive. Diode 76 conducts on positive voltage swings, however, so that only a negative voltage is developed across resistor 75.

When SCR 70 conducts, the anode voltage at the junction of resistors 71 and 73 decreases to attenuate the oscillator pulses coupled to transistor 21 sufficiently so that transistor 21 remains nonconducting. Accordingly, the horizontal deflection circuit is disabled by suppressing the drive signal to driver transistor 21 when the first sensing means provides a disablement signal to SCR 70 in response to current flow through the low voltage supply in excess of a predetermined magnitude.

A second sensing means is connected to the high voltage supply and to SCR 70 for providing a disablement signal to SCR 70 in response to current flow through the high voltage supply in excess of a predetermined magnitude. The second sensing means includes a current sensing resistor 80 connected between the return end of winding 43 and a potential reference level illustrated as a source of energizing voltage illustrated as a terminal 81. Source 81 can be one of sources 57 or 64. A capacitor 82 is connected from junction 79 between winding 43 and resistor 80 and circuit ground. A diode 83 is connected between the cathode of SCR 70 and junction 79 to isolate the second sensing means from the first sensing means. Resistor 77 also provides isolation so that the low impedance of resistor 75 does not prevent coupling a disablement signal via diode 83 to SCR 70.

The voltage at junction 79 varies with beam current. At zero beam current this voltage is equal to the voltage of source 81. As the beam current increases current is drawn through resistor 80 and the voltage across capacitor 82 decreases from a positive level. Brightness or beam current limiter 66 generally allows variation in beam current during normal operation. At some level of beam current, limiter 66 begins limiting the beam current in CRT 14 by providing an appropriate signal to video channel 13.

If the anode of CRT 14 is shorted to ground due to a faulty CRT, a service mistake, or for other reasons, or high voltage circuit 44 or transformer 34 is shorted, substantially higher anode current may flow in CRT 14. Such excessive anode current can be in excess of that which limiter 66 can control or limit. When the anode current increases sufficiently to cause the voltage at junction 79 to become negative, diode 83 conducts to provide a disablement signal to the cathode of SCR 70. SCR 70 switches on to disable the horizontal deflection circuit as was described previously. Accordingly, protection is provided against current flow through high voltage circuit 44 in excess of a predetermined magnitude.

A third sensing means includes winding 53 of transformer 34. The third sensing means is connected to the control or gate electrode of SCR 70 for providing a disablement signal thereto. The third sensing means includes a series connection between one end of winding 53 and the gate of SCR 70. The series connection includes a coil 84, a zener diode 85, a diode 86, and a coil 87 connected in that order between winding 53 and the gate of SCR 70. A capacitor 90 is connected between the junction of coil 84 with zener diode 85 and circuit ground. A resistor 91 is connected between the junction of diode 86 with coil 87 and circuit ground.

Faults such as an increased B+ voltage at terminal 27 or an open-circuited retrace capacitor 40 can cause the pulses induced in winding 43 to increase in amplitude so that high voltage circuit 44 generates an excessively high voltage. The excessively high voltage generated may damage components of the television receiver or cause CRT 14 to emit excessive X-rays. Since th pulses induced across winding 43 have a large amplitude, it is preferable to detect this fault condition by sensing pulse amplitudes across one of the other windings such as winding 53. Voltage pulses across winding 33 could also be sensed, however, lower voltage operation is desirable.

Under normal operating conditions, the voltage pulses across winding 53 are of insufficient magnitude to cause zener diode 85 to conduct. Thus, no disablement signal is coupled to the gate of SCR 70. Since the voltage across winding 53 may also have negative voltage swings, diode 86 prevents reverse current flow out of the gate of SCR 70. Alternatively, zener diode 85 may be replaced by a device which limits voltage in both directions.

If a fault condition occurs such that the voltage induced in secondary windings 53 of transformer 34 increases beyone a predetermined magnitude, zener diode 85 will conduct to couple a disablement signal to the gate of SCR 70 to switch SCR 70 on an disable the horizontal deflection circuit.

Coil 84 and capacitor 90 comprise a resonant or tuned circuit which increases the amplitude of the pulses coupled to zener diode 85 due to an open-circuited retrace capacitor 40. As was indicated above, capacitor 40 and horizontal deflection winding 35 are tuned to resonate during horizontal retrace with a period twice the horizontal retrace interval of about 12.4 microseconds. Accordingly, winding 35 and capacitor 40 have a resonant frequency slightly higher than 40 KHz.

If capacitor 40 becomes open-circuited, the retrace time becomes much shorter, that is, the retrace frequency increases greatly. Coil 84 and capacitor 90 are selected to have a resonant frequency substantially in excess of the normal retrace frequency. Thus, the normal flyback pulses developed across winding 53 are much lower in frequency than the resonant frequency of coil 84 and capacitor 90. However, when capacitor 40 opens and the retrace frequency becomes higher, the flyback pulses developed across winding 53 are of a shorter duration and closer to the resonant frequency of coil 84 and capacitor 90. Accordingly, the resonant circuit including coil 84 and capacitor 90 tends to peak the pulses induced in winding 53 to provide a greater amplitude pulse to zener diode 85. In one practical circuit including the invention, coil 84 and capacitor 90 were tuned to approximately the fifth harmonic of the retrace frequency with capacitor 40 open-circuited.

FIG. 2 is a waveform diagram to better illustrate the effect of coil 84 and capacitor 90. In the above-mentioned practical circuit, dashed line curve 92 was obtained with capacitor 40 open-circuited when coil 84 and capacitor 90 were not used. When coil 84 and capacitor 90 were added to the circuit, the solid line curve 93 was obtained which illustrates additional peaking of the fault condition pulses across winding 53. Thus, the tolerance of other circuit components such as zener diode 85 can be loosened because a larger change in pulse amplitude due to an open-circuited retrace capacitor 40 is provided.

Capacitor 74, coil 87, and resistor 91 are transient suppression components. When the television receiver is initially turned on, the various capacitors therein are not charged. Accordingly, substantial charging currents can be drawn until the capacitors are charged to their normal operating conditions. Capacitor 74 and resistor 91 prevent SCR 70 from switching on due to such conditions. These components together with coil 87 also inhibit SCR 70 from switching on due to momentary or transient signals which may be sensed by one of the various sensing means.

Accordingly, novel protection circuitry for a television receiver has been illustrated and described. Protection circuitry in accordance with the invention provides protection against numerous fault conditions which can occur in a television receiver without undue complexity or expense and without deleteriously affecting the operation of the television receiver. While there has been shown and described what is at present considered the preferred embodiment of the invention it will be obvious to those skilled in the art that various changes and modifications may be made therein without departing from the invention as defined by the appended claims.

What is claimed is:

1. In a television receiver having an image display device, a horizontal deflection winding associated therewith, a horizontal delfection circuit connected to said winding, an output transformer connected to said deflection circuit, a low voltage supply including a first winding of said output transformer, and a high voltage supply including a second winding of said output transformer, an improved protection circuit comprising a switching means connected to said horizontal deflection circuit for disabling said horizontal deflection circuit in response to fault conditions and plural sensing means including a first sensing means connected to said low voltage supply and to said switching means for providing a disablement signal to said switching means in response to current flow through said low voltage supply in excess of a predetermined magnitude wherein said improvement comprises:

a second sensing means connected to said high voltage supply and to said switching means for providing a disablement signal to said switching means in response to current flow through said high voltage supply in excess of a predetermined magnitude; and a third sensing means connected to said switching means and including a third winding of said output transformer for providing a disablement signal to said switching means in response to voltage pulses across said third winding in excess of a predetermined magnitude.

2. An improved protection circuit as defined in claim 1 wherein said second sensing means includes a current sensing resistor connected between said second winding and a potential reference level.

3. An improved protection circuit as defined in claim 1 wherein said third sensing means includes a resonant circuit for increaseing the amplitude of the pulses across said third winding in response to an open-circuited retrace capacitor.

4. An improved protection circuit as defined in claim 1 wherein said switching means includes a controlled rectifier having an anode electrode connected to said horizontal deflection circuit, a cathode electrode connected to said first and second sensing means, and a control electrode connected to said third sensing means.

5. An improved protection circuit as defined in claim 4 wherein said first and second current sensing resistors are connected to respective potential reference levels.

6. An improved protective circuit as defined in claim 4 wherein a diode is connected between said second sensing means and said controlled rectifier for isolating said second sensing means when the current flow through said high voltage supply is less than the predetermined magnitude.

* * * * *